(12) United States Patent
Nawrocki

(10) Patent No.: US 9,692,365 B2
(45) Date of Patent: Jun. 27, 2017

(54) ELECTRONIC PREAMPLIFIER SYSTEM

(71) Applicant: Piotr Nawrocki, Inowroclaw (PL)

(72) Inventor: Piotr Nawrocki, Inowroclaw (PL)

( * ) Notice: Subject to any disclaimer, the term of this patent is extended or adjusted under 35 U.S.C. 154(b) by 0 days.

(21) Appl. No.: 14/864,648

(22) Filed: Sep. 24, 2015

(65) Prior Publication Data

US 2017/0093351 A1    Mar. 30, 2017

(51) Int. Cl.
| | | |
|---|---|---|
| *H03F 99/00* | (2009.01) | |
| *H03F 3/185* | (2006.01) | |
| *H04R 3/04* | (2006.01) | |
| *H03G 3/30* | (2006.01) | |
| *H03F 3/68* | (2006.01) | |

(52) U.S. Cl.
CPC ........... *H03F 3/185* (2013.01); *H03G 3/3005* (2013.01); *H04R 3/04* (2013.01); *H03F 3/68* (2013.01); *H03F 2200/03* (2013.01)

(58) Field of Classification Search
CPC ...... H03F 3/185; H03F 1/565; H03F 2200/03; H03F 3/68; H03G 3/3005; H04R 3/04
USPC ...................... 330/3, 264, 277; 381/111, 120
See application file for complete search history.

(56) References Cited

U.S. PATENT DOCUMENTS

| | | | | |
|---|---|---|---|---|
| 6,737,915 | B1 * | 5/2004 | Harner ...................... | H03F 5/00 330/299 |
| 8,154,347 | B2 * | 4/2012 | Chiu .......................... | H03F 1/26 330/117 |
| 9,451,359 | B2 * | 9/2016 | Mucha ...................... | H04R 3/00 |
| 2009/0195317 | A1 * | 8/2009 | Zhang ................... | H03F 1/0277 330/295 |
| 2010/0322440 | A1 * | 12/2010 | Chiu ......................... | H03F 1/26 381/120 |

\* cited by examiner

*Primary Examiner* — Disler Paul
(74) *Attorney, Agent, or Firm* — Masuvalley & Partners

(57) ABSTRACT

A graphene microphone preamplifier is a minimalist design working in class A with large quiescent current in a push-pull configuration, with automatic balancing of voltage imbalance.

9 Claims, 6 Drawing Sheets

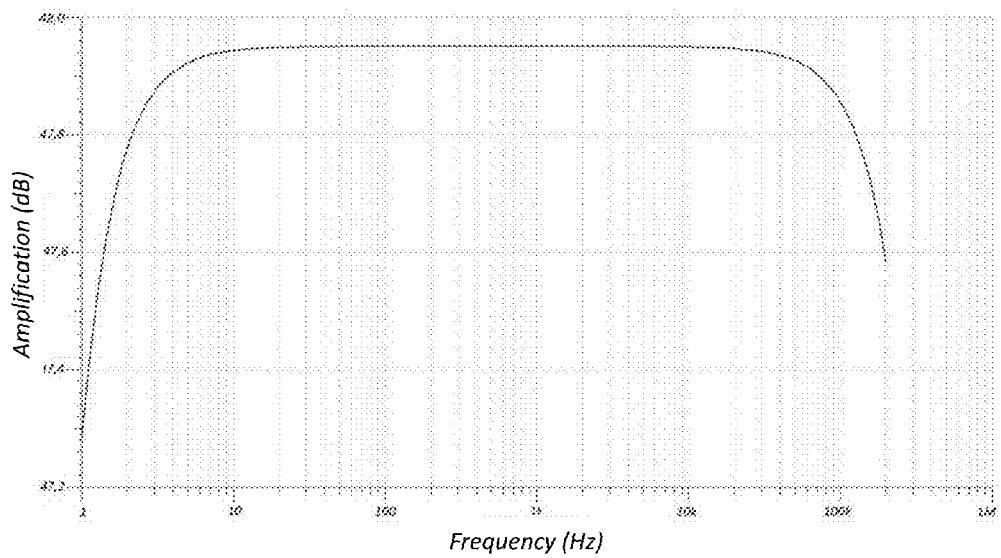
Fig. 7
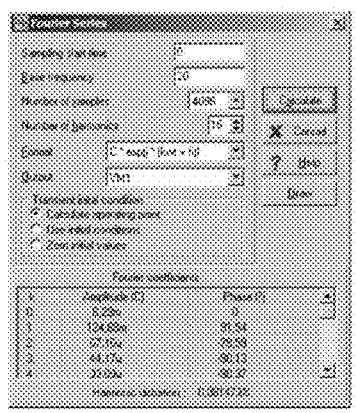 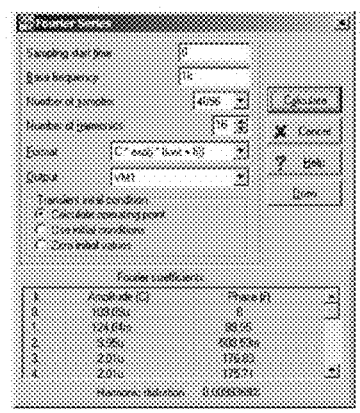
Fig. 8 Fig. 9

US 9,692,365 B2

ELECTRONIC PREAMPLIFIER SYSTEM

FIELD OF THE INVENTION

The present invention relates to an electronic preamplifier system, especially a microphone preamplifier.

BACKGROUND OF THE INVENTION

A microphone preamplifier is a device used to increase the level of the microphone signal (typically by millivolts) to values close to the line level. Although it is assumed that these devices are intended to serve as a low-frequency (LF) amplifier, their imperfections are often used in the process of creating sound. They can also be part of a larger whole, i.e. a microphone track (stand-alone or being part of the mixer) containing additional signal processors like noise gates, filters, compressor, DeEsser, parametric EQ, limiter.

In terms of the applied signal enhancer elements the following are distinguished:
Tube preamplifiers
Transistor preamplifiers
Discrete
Based on operational amplifiers Usually preamplifiers work in class A because of the required low level of harmonic distortion and relatively low power consumption. Due to the nature of the load strengthening voltage rather than power is sought. Typical maximum gain value of the voltage range from 50 to 70 dB. In addition, a switched muffler is often installed on the input of the device, reducing the value of the signal in the event of a high level (condenser microphone signals can reach up to a few volts). A signal phase inverter, AC symmetrical voltage ±48 V (i.e. Phantom power) for condenser microphones and high-pass filter are other frequently encountered additional elements.

The present invention relates to a low-frequency voltage amplifier (LF) designed to work with a graphene microphone, inter alia. The intended use is to increase the level of received acoustic signal at the output of a graphene microphone with the amplitude of millivolts to values close to the line level. Moreover, as everyone knows each element of the acoustic route and the way preamplifiers and power systems are designed have an impact on the nature of sound quality driving in fact the power amplifier. The type and quality of the components used to build audio tracks (especially microphone preamplifiers) have a significant impact on the nature and quality of the sound, as for an amplifier according to the invention minimal impact on the change in the nature of the reproduced audio signal from the microphone was achieved.

Publication US 20100322440 A1 discloses an audio signal processing circuit derived from a microphone, which comprises two symmetrical preamplifier and amplifier paths. This solution allows to obtain a higher quality signal by comparing the two differential output signals, but the end result still leaves much to be desired because of the sensitivity of the circuit to the quality of elements used, and the frequent use of inferior components on account of their price.

Also US 2014153746 A1 discloses a preamplifier, dedicated to cooperation with the microphone. The solution allows a significant reduction in the space occupied by the circuit in the printed circuit board and to reduce power consumption by the preamplifier. It does not solve the problem of significant sensitivity of the circuit to the quality of the components used.

In the light of these solutions it can be seen that there are no preamplifiers dedicated to cooperate with the microphones that provide high quality of the processed signals, even when using less expensive components.

OBJECTS AND SUMMARY OF THE INVENTION

According to the invention an electronic amplifier, in particular a microphone one, comprising a voltage amplifier, a voltage amplifier load and a voltage amplifier power supply, wherein
said voltage amplifier comprises two branches, each of which includes:
a transistor (T, T') of the MOSFET type;
a capacitor (C1, C1') with one end connected to the gate of said transistor (T, T');
a capacitor (C2, C2') and a resistor (R1, R1') is connected to the drain of said transistor (T, T'), wherein said capacitor (C2, C2') and a resistor (R1, R1') are interconnected parallel;
a diode (D, D'), preferably a Zener diode, connected at one end to a source of said transistor (T, T') and the second end of the resistor (R2, R2') and the capacitor (C1, C1'), wherein the diode (D) of a first branch connected to the cathode of a source of the transistor (T) and the anode with a resistor (R2) and capacitor (C1) and the diode (D') of the second branch connects via the cathode to a source of the transistor (T') and via the anode with the resistor (R2') and the capacitor (C1');
a resistor (R3, R3') connected to said resistor (R1, R1') and a resistor (R2, R2')
wherein said branches are connected to each other by means of:
a resistor (R4) which at one end is connected to the resistors (R2) and (R3) of the first branch and the second end of the resistor (R2') and (R3') of the second branch, and
a resistor (R0), one end of which is connected to the cathode of the diode (D) and the source of the transistor (T) of the first branch and the anode of the diode (D') and the source of the transistor (T') of the second branch.
and the capacitor (C1) of the first branch and the capacitor (C1') of the second branch are interconnected by ends remote from gate transistor (T), (T');
said voltage amplifier power supply includes:
two PI filters, each of which comprises a resistor (R5, R5'), preferably with a value of 1Ω, coupled to a first side of the capacitor (C3, C3'), on the other—to the capacitor (C4, C4');
wherein the capacitor (C3) is connected to the capacitor C3' and the capacitor C4 is connected to the capacitor C4';
a battery of electrolytic capacitors connected to the first side of the capacitor (C4) and the resistor (R5) of the first filter, on the other hand, the capacitor (C4') and the resistor (R5') of the second filter,
said voltage amplifier load includes the resistor Rn and the receiver of an audio signal connected to each other;
wherein said voltage amplifier is adapted to attach it:
by input with an audio signal source through the capacitor (C1) with an end remote from the transistor (T) of the first branch and the capacitor (C1') with an end remote from the transistor (T') of the second branch, wherein the audio source is connected in parallel with the resistor (Rz), preferably with a value of 1Ω.

with said power supply of the voltage amplifier by:

the capacitor (C3, C3') and the resistor (R5, R5') connected with the resistor (R1, R1') and the resistor (R3, R3'), the resistor (R0), which is connected by the end remote from the transistor (T), (T') and the diode (D), (D') to the capacitor (C3) of the first branch and the capacitor (C3') of the second branch, and then with the capacitors (C4) of the first branch and the capacitor (C4') of the second branch, and further to ground.

with said load of the voltage amplifier by:
the capacitor (C2) of the first branch and the capacitor (C2') of the second branch connected with the resistor (R) and the audio signal receiver.

Preferably, the first branch of said amplifier is supplied with negative voltage, and the second branch—positive voltage.

Preferably, the branch amplifier supplied with a positive voltage for the field effect transistor with an insulated IGFET gate MOSFET type with N-type enriched channel.

Preferably, the branch amplifier supplied with a negative voltage for the field effect transistor with an insulated IGFET gate MOSFET type with P-type enriched channel.

Preferably, the resistor (RO) is used to adjust the amplifier gain.

Preferably, it is configured to operate without global feedback in open loop feedback.

Preferably, it contains additional signal processors, preferably noise gates, filters, dynamics compressors, parametric equalisers or limiters.

Preferably, it is part of a larger system, in particular track microphone, alone or in a mixer or console.

Preferably, additionally it has one or more of the following elements installed at the input: matching transformer, isolation transformer, silencer, follower (input and output impedance transformer).

BRIEF DESCRIPTION OF THE DRAWINGS

The invention will now be further described in the preferred embodiment, with reference to the accompanying drawings, in which:

FIG. 7 shows the frequency response bandwidth measurement of the graphene microphone preamplifier.

FIG. 8 shows a measure of distortion for frequencies of 20 Hz of the graphene microphone preamplifier.

FIG. 9 shows a measure of distortion for frequencies of 1 kHz of the graphene microphone preamplifier.

DESCRIPTION OF EMBODIMENTS

Figure 1:
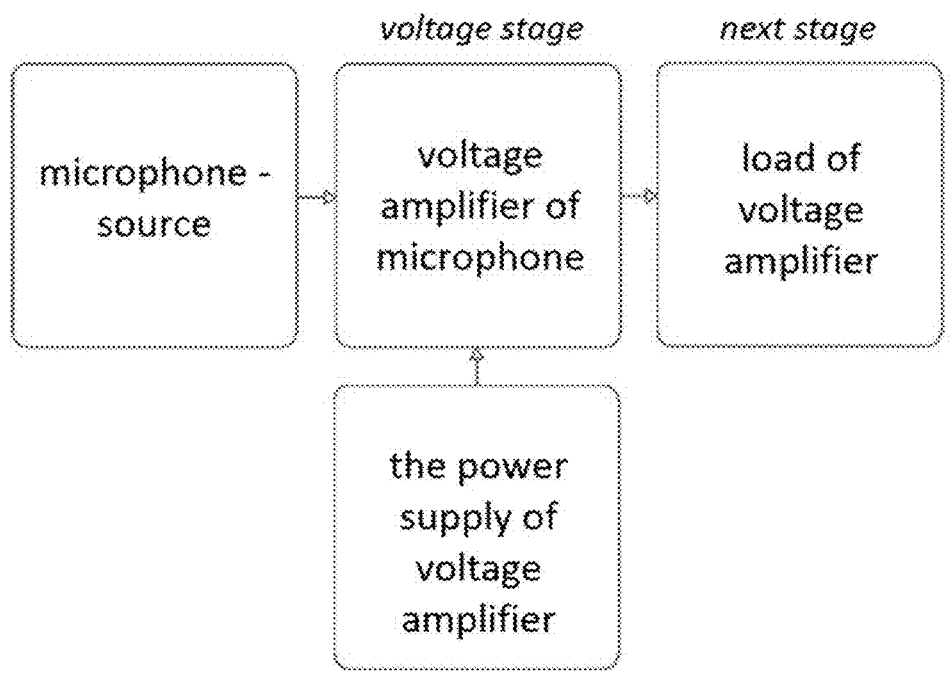
FIG. 1 shows a block diagram of a graphene microphone preamplifier.

Specific embodiments of the invention will now be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the embodiments illustrated in the accompanying drawings is not intended to be limiting of the invention. In the drawings, like numbers refer to like elements.

The figures use the following indications:

T—field transistor with the insulated gate IGFET MOSFET type with P-type enriched channel in the amplifier branch supplied with negative voltage, T'—the field transistor with IGFET gate MOSFET type with N-type enriched channel in the amplifier branch supplied with positive voltage; D—Zener diode in the branch of a negative supplied voltage amplifier; D'—Zener diode in the branch amplifier of a positive supplied voltage amplifier; C1-C4 —capacitors in the branch a negative voltage supplied amplifier; C1'-C4'—capacitors in the branch a positive voltage supplied amplifier; R1-R5—resistors in the branch a negative voltage supplied amplifier; R1'-R5'—resistors capacitors in the branch a positive voltage supplied amplifier; Rz—resistor located in the source audio signal with a value of 1 MΩ; Rn—resistor located in the input source voltage amplifier load.

Preferred Embodiments of the Invention

Figure 2:
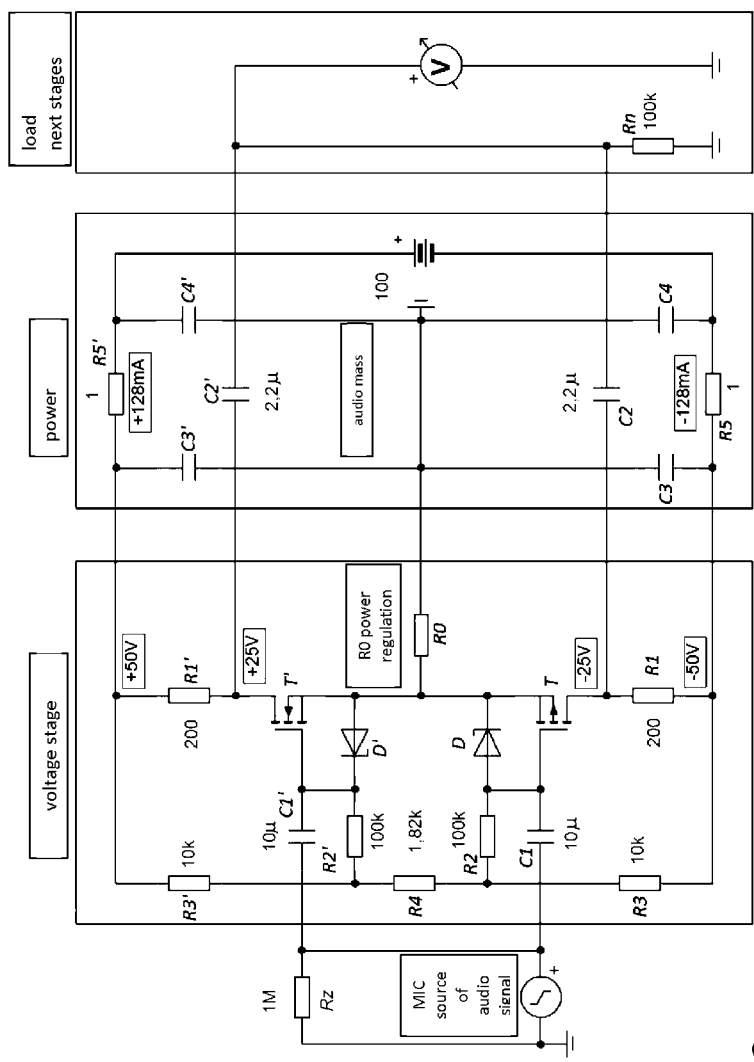
FIG. 2 shows an application block diagram of a graphene microphone preamplifier.

The graphene microphone preamplifier system described below works in class A due to the required low level of distortion. A block diagram of the graphene microphone preamplifier is shown in FIG. 1. An application diagram of the graphene microphone preamplifier is shown in FIG. 2.

Figure 3:
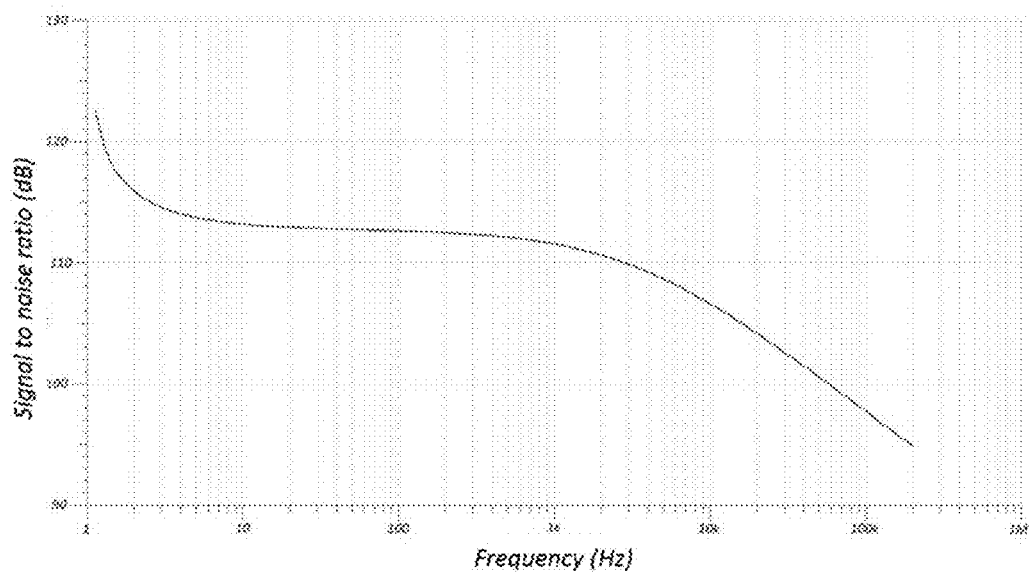
FIG. 3 shows a measurement of the useful signal relative to graphene microphone preamplifier noise.
Figure 4:
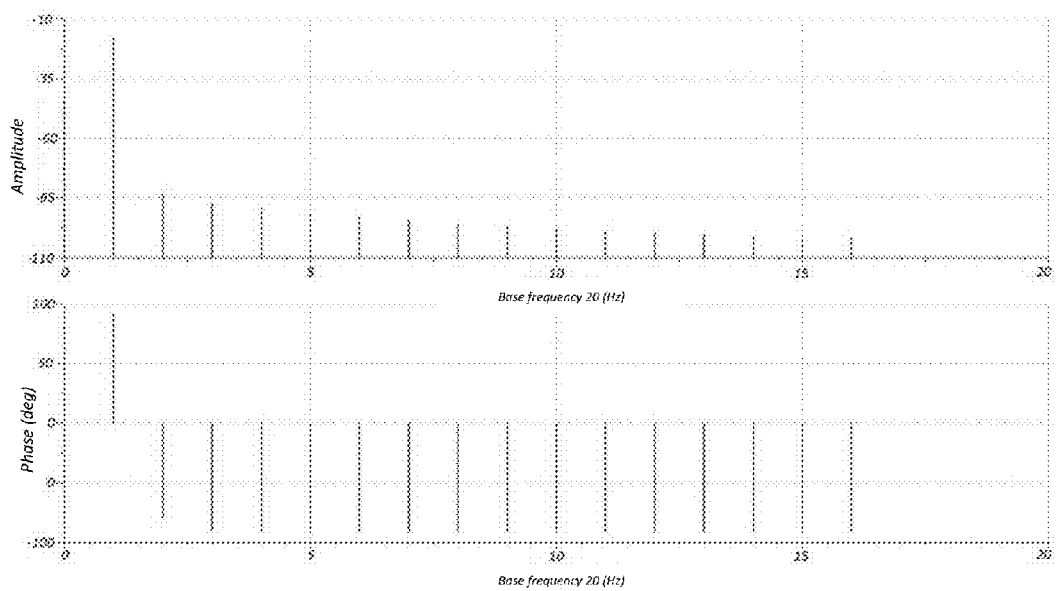
FIG. 4 shows the harmonic distribution for 20 Hz frequency of the graphene microphone preamplifier.
Figure 5:
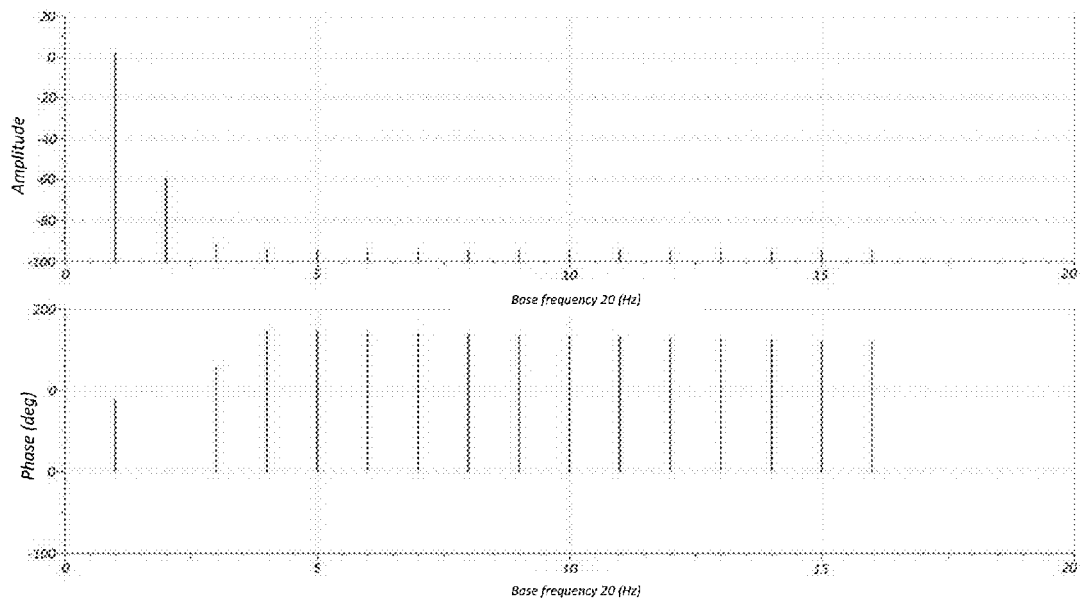
FIG. 5 shows the harmonic distribution for 1 kHz frequency of the graphene microphone preamplifier.
Figure 6:
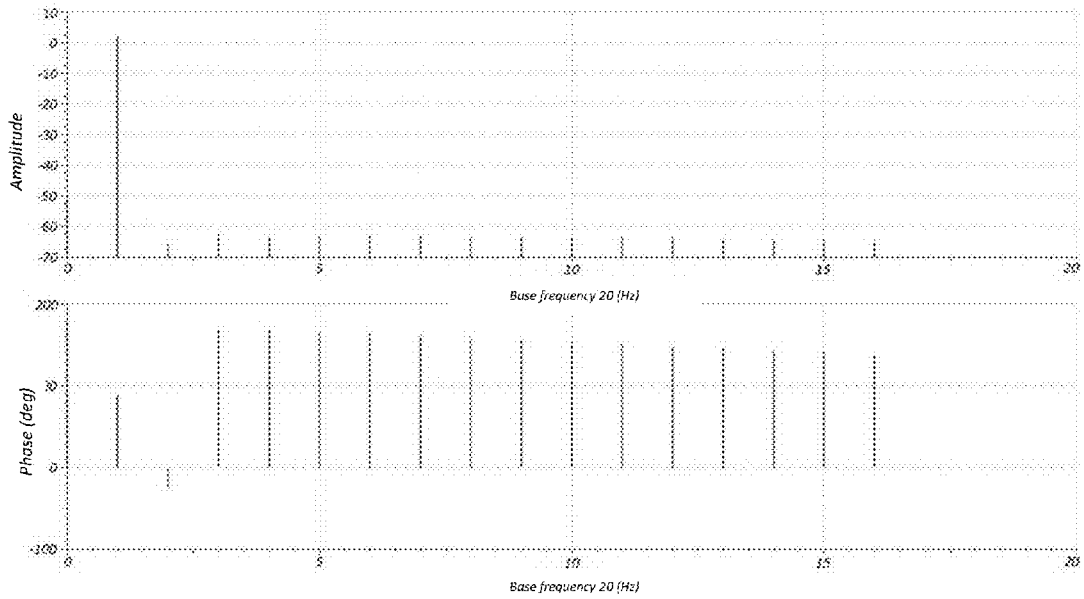
FIG. 6 shows the harmonic distribution for 20 kHz frequency of the graphene microphone preamplifier.

The system operates with a relatively large quiescent current. That gives a high ratio of preamplifier signal-to-noise which is shown in FIG. 3 and a very good distribution of the harmonics even at relatively high gain voltage across the audio band. Harmonics distribution for 20 Hz, 1 kHz and 20 kHz frequencies are shown in FIG. 4, FIG. 5 and FIG. 6 respectively.

Figure 10:
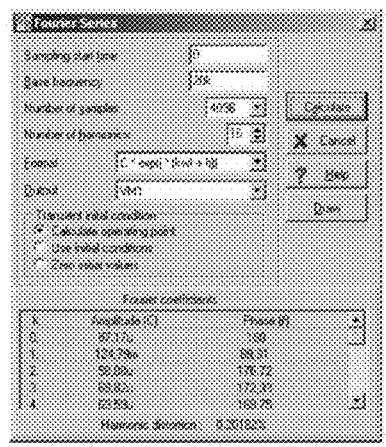
FIG. 10 shows a measure of distortion for frequencies of 20 kHz of the graphene microphone preamplifier.

The system operates without global feedback open-loop. Nevertheless, a high frequency response was obtained and thus a high speed amplifier obtained. Measuring the frequency response of the band is shown in FIG. 7. A small nonlinear distortion of the preamplifier was also achieved. Measurement of nonlinear distortion of the preamplifier for 20 Hz, 1 kHz and 20 kHz frequencies are shown in FIG. 8, FIG. 9 and FIG. 10 respectively.

Figure 11:
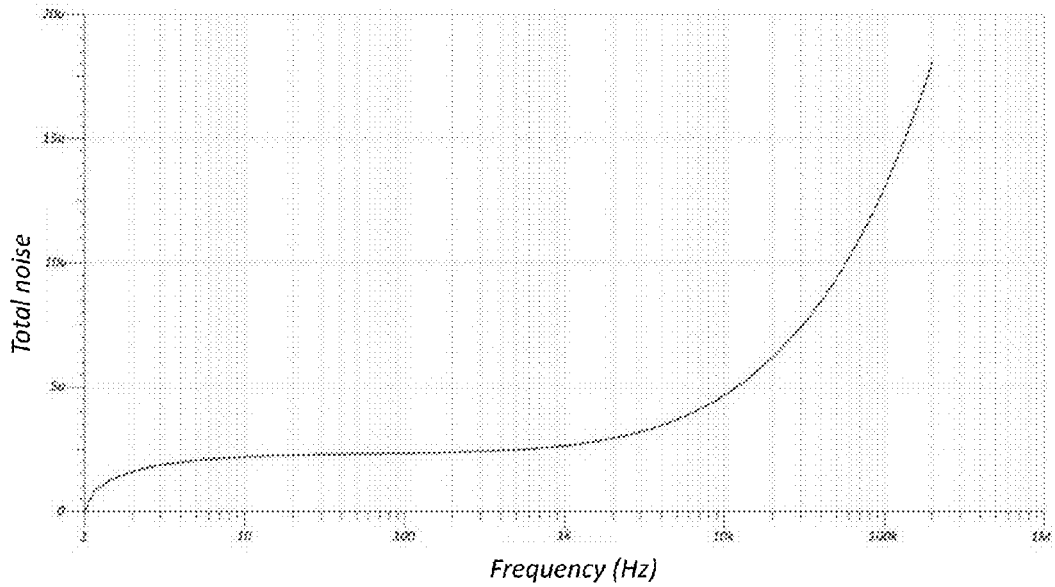
FIG. 11 shows the measurement of the total noise of the graphene microphone preamplifier.

Adjusting the amplification of the system is obtained by changing the resistor value R0 (from 0Ω to 2Ω). Voltage amplification of the amplifier is the ratio of the resistor R1 and R1' (200Ω) to the sum of the dynamic resistance of transistor T and T' and the resistor R0. Voltage amplification is controlled in the range of 1 to 170 times by the total noise to approx. 7 μV microvolts audio band. The total preamplifier noise is shown in FIG. 11.

For proper operation of the microphone preamplifier system balanced voltage is necessary. Such requirements are met by the supply system with very good filtration and simple structure implemented to supply the graphene microphone preamplifier.

The power supply system is integrated with the preamplifier of the microphone, as shown in FIG. 2.

The main source of the system power supply is unbalanced voltage. The microphone amplifier system by virtue of its construction produces balanced voltage by itself. From one power supply we obtain two balanced voltages necessary for the proper operation of the transistors T and T' reinforcing audio. So the PSU is purposely a very simple solution based on a battery of electrolytic capacitors of high filtering capacity. After the automatic voltage balancing the power supply filter was separated as a balanced PI filter. An equal number of filter capacitors C3 and C4 and C3' and C4' is divided respectively by a resistor R5 and R5' the value of 1Ω where the measurement of the quiescent current for the microphone amplifier branch supplied with positive and negative voltage is done. In addition, the preamplifier system generates the system analogue mass which separated itself in the process of balancing the voltages. At the contact point of the sources of the audio transistors T and T' and resistor R0 is applied there will always be the offset voltage of the amplifier equal to 0, resulting in the generation of minimal distortion of the reproduced audio signal.

In this way, the graphene microphone amplifier generates audio mass by itself. Accordingly, the present arrangement balances itself. In this configuration the graphene microphone amplifier circuit will always be in the declared class A with the specified criteria.

The system was built using a minimum number of parts, based on discrete MOS-FET transistors T and T' used in the push-pull configuration art of audio. For proper arrangements of T and T' transistors work points, which is their proper functioning, passive components i.e. resistors and capacitors were used. Capacitors serve as separating means. At the same time they block and prevent the passage of the DC component present in the pre-amp to the graphene microphone to other levels of audio system with which it can work. In addition to proper operation of the whole system you need a power transformer lowering the grid ~230V voltage to the desired value, a bridge rectifier and power supply filter electrolytic capacitors, which supply power to the unit.

Minimalist design and audio channels active elements used to build preamplifiers have a positive impact on the process of creating sound, but due to the topology of system it was brought to a minimum. Therefore, this design of the microphone preamplifier for use as an amplifier used to amplify acoustic signals from a graphene microphone has been designed under the criteria relating to first-class equipment of this type.

The device is particularly recommended for electroacousticians, sound engineers and producers, musicians, etc.

Presented microphone preamplifier can also be part of a larger whole, i.e. the microphone track, alone or being part of a mixer, console, including additional signal processors, such as, for example a noise gate, filters, dynamics compressors, parametric equalisers, limiters, etc.

In addition, you can install a matching or isolation transformer, a silencer, a follower (impedance transformer input and output) on the device input, reducing both the value of amplified audio signal in case of a high-level output voltage from microphone when the input signal fed to an amplifier microphone reaches even tens of millivolts, which in turn can lead to overload and an increase in the degree of distortion.

The graphene microphone preamplifier is a minimalist design working in class A with large quiescent current in a push-pull configuration, with automatic balancing of voltage imbalance.

Because of the design solution the system is stable without negative feedback, in the open-loop with a wide bandwidth frequency response.

The preamplifier has a high signal amplification from the source—e.g. the graphene microphone. Preamplifier amplification adjustment is obtained by changing the value of one element in an isolated circuit variable component.

The microphone preamplifier system automatically generates a circuit analogue mass, which is also the main ground which separated itself in the process of balancing the supply voltage on switching the power—even though the main power source of the present system voltage is unbalanced.

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the drawings and descriptions herein are proffered by way of example to facilitate comprehension of the invention and should not be construed to limit the scope thereof.

The invention claimed is:

1. An electronic preamplifier system, in particular a microphone, comprising a voltage amplifier, a voltage amplifier load and a voltage amplifier power supply, wherein
   said voltage amplifier comprises two branches, each of which includes:
   a transistor (T, T') of the MOSFET type;
   a capacitor (C1, C1') with one end connected to the gate of said transistor (T, T');
   a capacitor (C2, C2') and a resistor (R1, R1') is connected to the drain of said transistor (T, T'), wherein said capacitor (C2, C2') and a resistor (R1, R1') are interconnected parallel;
   a diode (D, D'), a Zener diode, connected at one end to a source of said transistor (T, T') and the second end of a resistor (R2, R2') and the capacitor (C1, C1'), wherein the diode of a first branch connected to the cathode of a source of the transistor (T) and the anode with the resistor (R2) and capacitor (C1) and the diode (D') of the second branch connects via the cathode to a source of the transistor (T') and via the anode with the resistor (R2') and the capacitor (C1');
   a resistor (R3, R3') connected to said resistor (R1, R1') and the resistor (R2, R2')
   wherein said branches are connected to each other by means of:
   a resistor (R4) which at one end is connected to the resistors (R2) and (R3) of the first branch and the second end of the resistor (R2') and (R3') of the second branch, and
   a resistor (R0), one end of which is connected to the cathode of the diode (D) and the source of the transistor (T) of the first branch and the anode of the diode (D') and the source of the transistor (T') of the second branch
   and the capacitor (C1) of the first branch and the capacitor (C1') of the second branch are interconnected by ends remote from gate transistor (T), (T');
   said voltage amplifier power supply includes:

two PI filters, each of which comprises a resistor (R5, R5'), with a value of 1Ω, coupled to a first side of a capacitor (C3, C3'), on the other—to a capacitor (C4, C4');

wherein the capacitor (C3) is connected to the capacitor C3' and the capacitor C4 is connected to the capacitor C4';

a battery of electrolytic capacitors connected to the first side of the capacitor (C4) and the resistor (R5) of the first filter, on the other hand, the capacitor (C4') and the resistor (R5') of the second filter, said voltage amplifier load includes the resistor Rn and the receiver of an audio signal connected to each other;

wherein said voltage amplifier is adapted to attach:

by input with an audio signal source through the capacitor (C1) with an end remote from the transistor (T) of the first branch and the capacitor (C1') with an end remote from the transistor (T') of the second branch, wherein the audio source is connected in parallel with the resistor (Rz), with a value of 1MΩ with said power supply of the voltage amplifier by:

the capacitor (C3, C3') and the resistor (R5, R5') connected with the resistor (R1, R1') and the resistor (R3, R3'), the resistor (R0), which is connected by the end remote from the transistor (T), (T') and the diode (D), (D') to the capacitor (C3) of the first branch and the capacitor (C3') of the second branch, and then with the capacitors (C4) of the first branch and the capacitor (C4') of the second branch, and further to ground with said load of the voltage amplifier by:

the capacitor (C2) of the first branch and the capacitor (C2') of the second branch connected with the resistor (R) and the audio signal receiver.

2. Electronic preamplifier system of claim 1, characterised in that the first branch of said amplifier is supplied with negative voltage, and the second branch—positive voltage.

3. Electronic preamplifier system of claim 2, characterised in that the branch amplifier supplied with a positive voltage for the field effect transistor with an insulated IGFET gate MOSFET type with N-type enriched channel.

4. Electronic preamplifier system of claim 2, characterised in that the branch amplifier supplied with a negative voltage for the field effect transistor with an insulated IGFET gate MOSFET type with P-type enriched channel.

5. Electronic preamplifier system of claim 1 characterised in that a resistor (R0) is used to control amplifier gain.

6. The electronic system of the preamplifier according to claim 1, characterised, in that the electronic system of the preamplifier is configured to operate without global feedback in open loop feedback compression.

7. The electronic system of the preamplifier according to claim 1, characterised in that the electronic system of the preamplifier comprises additional signal processors, noise gates, filters, dynamics compressors, parametric equalisers or limiters.

8. The electronic system of the preamplifier according to claim 1, characterised in that the electronic system of the preamplifier is part of a larger system, in particular a microphone track alone or in a mixer or a console.

9. The electronic system of the preamplifier according to claim 1, characterised in that the electronic system of the preamplifier additionally has installed at an entrance one or more of the following components: matching transformer, isolation transformer, silencer, follower (input and output impedance transformer).

* * * * *